US011043792B2

(12) United States Patent
Han et al.

(10) Patent No.: US 11,043,792 B2
(45) Date of Patent: Jun. 22, 2021

(54) METHOD FOR GAN VERTICAL MICROCAVITY SURFACE EMITTING LASER (VCSEL)

(71) Applicant: Yale University, New Haven, CT (US)

(72) Inventors: Jung Han, Woodbridge, CT (US); Cheng Zhang, New Haven, CT (US)

(73) Assignee: Yale University, New Haven, CT (US)

( * ) Notice: Subject to any disclaimer, the term of this patent is extended or adjusted under 35 U.S.C. 154(b) by 0 days.

(21) Appl. No.: 15/515,302

(22) PCT Filed: Sep. 30, 2015

(86) PCT No.: PCT/US2015/053254
§ 371 (c)(1),
(2) Date: Mar. 29, 2017

(87) PCT Pub. No.: WO2016/054232
PCT Pub. Date: Apr. 7, 2016

(65) Prior Publication Data
US 2017/0237234 A1    Aug. 17, 2017

Related U.S. Application Data

(60) Provisional application No. 62/057,543, filed on Sep. 30, 2014.

(51) Int. Cl.
*H01S 5/00* (2006.01)
*H01S 5/343* (2006.01)
(Continued)

(52) U.S. Cl.
CPC .... *H01S 5/34333* (2013.01); *H01L 21/30635* (2013.01); *H01L 33/10* (2013.01);
(Continued)

(58) Field of Classification Search
CPC ............ H01S 5/34333; H01S 5/18361; H01S 5/18308; H01S 5/1042; H01S 5/183;
(Continued)

(56) References Cited

U.S. PATENT DOCUMENTS 5,262,021 A   11/1993  Volker et al.
5,307,361 A    4/1994  Kahen et al.
(Continued)

FOREIGN PATENT DOCUMENTS

CN   101443887 A    5/2009
CN   102782818 A   11/2012
(Continued)

OTHER PUBLICATIONS

International Search Report and Written Opinion dated Dec. 29, 2015 for Application No. PCT/US2015/053254.
(Continued)

*Primary Examiner* — Vu A Vu
(74) *Attorney, Agent, or Firm* — Wolf, Greenfield & Sacks, P.C.

(57) ABSTRACT

Structures and methods for forming highly uniform and high-porosity gallium-nitride layers with sub-100-nm pore sizes are described. Electrochemical etching of heavily-doped gallium nitride at low bias voltages in concentrated nitric acid is used to form the porous gallium nitride. The porous layers may be used in reflective structures for integrated optical devices such as VCSELs and LEDs.

22 Claims, 9 Drawing Sheets

(51) Int. Cl.
*H01L 33/16* (2010.01)
*H01L 33/32* (2010.01)
*H01L 33/10* (2010.01)
*H01S 5/183* (2006.01)
*H01L 21/3063* (2006.01)
*H01S 5/10* (2021.01)
*H01S 5/187* (2006.01)
*H01S 5/30* (2006.01)

(52) U.S. Cl.
CPC ............. *H01L 33/16* (2013.01); *H01L 33/32* (2013.01); *H01S 5/1042* (2013.01); *H01S 5/183* (2013.01); *H01S 5/187* (2013.01); *H01S 5/18308* (2013.01); *H01S 5/18361* (2013.01); *H01S 5/18369* (2013.01); *H01S 5/305* (2013.01)

(58) Field of Classification Search
CPC ...... H01S 5/187; H01S 5/18369; H01S 5/305; H01L 21/30635; H01L 33/10; H01L 33/16; H01L 33/32
USPC .................................................. 372/45.012
See application file for complete search history.

(56) References Cited

U.S. PATENT DOCUMENTS

| | | | |
|---|---|---|---|
| 5,502,787 A | 3/1996 | Capasso et al. | |
| 5,509,026 A | 4/1996 | Sasaki et al. | |
| 5,644,156 A | 7/1997 | Suzuki et al. | |
| 5,818,861 A | 10/1998 | Tan et al. | |
| 5,919,430 A | 7/1999 | Hasenzahl et al. | |
| 6,233,267 B1 | 5/2001 | Nurmikko et al. | |
| 6,306,672 B1 | 10/2001 | Kim | |
| 6,320,206 B1 | 11/2001 | Coman et al. | |
| 6,537,838 B2 | 3/2003 | Stockman | |
| 6,597,017 B1 | 7/2003 | Seko et al. | |
| 6,597,490 B2 | 7/2003 | Tayebati | |
| 6,759,310 B2 | 7/2004 | Hiroshi | |
| 6,990,132 B2 | 1/2006 | Kneissl et al. | |
| 7,271,417 B2 * | 9/2007 | Chen ...................... H01L 33/18 257/103 | |
| 7,750,234 B2 | 7/2010 | Deng et al. | |
| 7,751,455 B2 | 7/2010 | Kneissl | |
| 7,923,275 B2 | 4/2011 | Nakagawa | |
| 7,928,448 B2 * | 4/2011 | Wierer, Jr. ............. H01L 33/32 257/79 | |
| 7,989,323 B2 | 8/2011 | Shenai-Khatkhate | |
| 8,174,025 B2 * | 5/2012 | Epler ...................... H01L 33/16 257/79 | |
| 8,343,788 B2 | 1/2013 | Kuo et al. | |
| 8,344,409 B2 | 1/2013 | Peng et al. | |
| 8,497,171 B1 | 7/2013 | Wu et al. | |
| 8,507,925 B2 | 8/2013 | Kuo et al. | |
| 8,519,430 B2 | 8/2013 | Peng et al. | |
| 9,206,524 B2 | 12/2015 | Zhang et al. | |
| 9,356,187 B2 | 5/2016 | Ryu et al. | |
| 9,583,353 B2 | 2/2017 | Han | |
| 2002/0036295 A1 | 3/2002 | Nunoue et al. | |
| 2002/0070125 A1 | 6/2002 | Ng et al. | |
| 2002/0075929 A1 | 6/2002 | Cunningham | |
| 2002/0153595 A1 | 10/2002 | Tayanaka | |
| 2002/0158265 A1 | 10/2002 | Eisenbeiser | |
| 2003/0178633 A1 | 9/2003 | Flynn et al. | |
| 2003/0180980 A1 | 9/2003 | Margalith et al. | |
| 2003/0189963 A1 | 10/2003 | Deppe et al. | |
| 2004/0021147 A1 | 2/2004 | Ishibashi | |
| 2004/0104398 A1 | 6/2004 | Hon et al. | |
| 2005/0029224 A1 | 2/2005 | Bernard et al. | |
| 2005/0184307 A1 | 8/2005 | Li et al. | |
| 2005/0224816 A1 | 10/2005 | Kim et al. | |
| 2005/0242365 A1 | 11/2005 | Yoo | |
| 2006/0046513 A1 | 3/2006 | Shea et al. | |
| 2006/0081832 A1 | 4/2006 | Chen | |
| 2006/0110926 A1 | 5/2006 | Hu et al. | |
| 2006/0199353 A1 | 9/2006 | Kub et al. | |
| 2007/0007241 A1 | 1/2007 | DeLouise | |
| 2007/0040162 A1 * | 2/2007 | Song ...................... H01L 33/42 257/13 | |
| 2007/0085100 A1 | 4/2007 | Diana et al. | |
| 2007/0111345 A1 | 5/2007 | Wong et al. | |
| 2007/0194330 A1 | 8/2007 | Ibbetson et al. | |
| 2007/0284607 A1 | 12/2007 | Epler et al. | |
| 2008/0029773 A1 | 2/2008 | Jorgenson | |
| 2008/0067532 A1 | 3/2008 | Watson et al. | |
| 2008/0179605 A1 | 7/2008 | Takase et al. | |
| 2008/0280140 A1 | 11/2008 | Ferrari et al. | |
| 2008/0285610 A1 | 11/2008 | Hall et al. | |
| 2008/0296173 A1 | 12/2008 | Mishra | |
| 2008/0298419 A1 | 12/2008 | Hori et al. | |
| 2009/0001416 A1 | 1/2009 | Chua et al. | |
| 2009/0117675 A1 | 5/2009 | Yamanaka et al. | |
| 2009/0140274 A1 | 6/2009 | Wierer, Jr. et al. | |
| 2009/0143227 A1 | 6/2009 | Dubrow et al. | |
| 2009/0168819 A1 | 7/2009 | Otama | |
| 2009/0173373 A1 | 7/2009 | Walukiewicz et al. | |
| 2010/0142576 A1 | 6/2010 | Cohen et al. | |
| 2010/0195689 A1 | 8/2010 | Ariga et al. | |
| 2010/0246625 A1 | 9/2010 | Kawashima et al. | |
| 2010/0270649 A1 | 10/2010 | Ishibashi et al. | |
| 2010/0317132 A1 | 12/2010 | Rogers et al. | |
| 2011/0076854 A1 | 3/2011 | Takeo et al. | |
| 2011/0101391 A1 | 5/2011 | Miki et al. | |
| 2011/0188528 A1 | 8/2011 | Kisin et al. | |
| 2012/0018753 A1 | 1/2012 | Hao et al. | |
| 2012/0025231 A1 | 2/2012 | Krames et al. | |
| 2012/0068214 A1 | 3/2012 | Kuo et al. | |
| 2012/0189030 A1 | 7/2012 | Miyoshi | |
| 2012/0205665 A1 | 8/2012 | Nam et al. | |
| 2013/0011656 A1 * | 1/2013 | Zhang ...................... C30B 33/10 428/312.8 | |
| 2013/0050686 A1 | 2/2013 | Wunderer et al. | |
| 2013/0134457 A1 | 5/2013 | Peng et al. | |
| 2013/0140517 A1 | 6/2013 | Tang et al. | |
| 2013/0207237 A1 | 8/2013 | Weisbuch et al. | |
| 2013/0210180 A1 | 8/2013 | Wang | |
| 2013/0248911 A1 | 9/2013 | Hwang et al. | |
| 2013/0328102 A1 | 12/2013 | Peng et al. | |
| 2013/0334555 A1 | 12/2013 | Hsieh et al. | |
| 2014/0003458 A1 | 1/2014 | Jung | |
| 2014/0048830 A1 | 2/2014 | Kuo et al. | |
| 2014/0064313 A1 | 3/2014 | Sato et al. | |
| 2014/0191369 A1 | 7/2014 | Tsuchiya et al. | |
| 2014/0203292 A1 | 7/2014 | Hwang et al. | |
| 2014/0339566 A1 * | 11/2014 | Seo ...................... H01L 33/007 257/76 | |
| 2015/0303655 A1 | 10/2015 | Han et al. | |
| 2016/0153113 A1 | 6/2016 | Zhang et al. | |
| 2016/0197151 A1 | 7/2016 | Han et al. | |
| 2017/0133826 A1 | 5/2017 | Han | |
| 2018/0152003 A1 | 5/2018 | Han et al. | |

FOREIGN PATENT DOCUMENTS

| | | |
|---|---|---|
| CN | 102823089 A | 12/2012 |
| CN | 103762286 A | 4/2014 |
| CN | 104205369 A | 12/2014 |
| JP | H05-315316 A | 11/1993 |
| JP | H10-135500 A | 5/1998 |
| JP | H11-195562 A | 7/1999 |
| JP | 2000-124552 A | 4/2000 |
| JP | 2000-349267 A | 12/2000 |
| JP | 2001-188264 A | 7/2001 |
| JP | 2001-223165 A | 8/2001 |
| JP | 2004-055611 A | 2/2004 |
| JP | 2005-244089 A | 9/2005 |
| JP | 2006-332595 A | 12/2006 |
| JP | 2007-073945 A | 3/2007 |
| JP | 2007-518075 | 7/2007 |
| JP | 2007-335879 A | 12/2007 |
| JP | 2008-226974 A | 9/2008 |
| JP | 2009-055056 A | 3/2009 |
| JP | 2009-067658 A | 4/2009 |

(56) References Cited

FOREIGN PATENT DOCUMENTS

| | | |
|---|---|---|
| JP | 2009-094360 A | 4/2009 |
| JP | 2009-231833 A | 10/2009 |
| JP | 2009-239034 A | 10/2009 |
| JP | 2010-218510 A | 9/2010 |
| JP | 2012-049292 A | 3/2012 |
| JP | 2013-038394 A | 2/2013 |
| JP | 2013-518447 A | 5/2013 |
| JP | 2014-507069 A | 3/2014 |
| KR | 2000-0038997 A | 7/2000 |
| KR | 10-0480764 B1 | 6/2005 |
| WO | WO 2005/066612 A2 | 7/2005 |
| WO | WO 2009/048265 A1 | 4/2009 |
| WO | WO 2011/013621 A1 | 2/2011 |
| WO | WO 2011/094391 A1 | 8/2011 |
| WO | WO 2013/0050686 A1 | 4/2013 |
| WO | WO 2014/061174 A1 | 4/2014 |

OTHER PUBLICATIONS

Amano et al., P-Type Conduction in Mg-Doped GaN Treated with Low-Energy Electron Beam Irradiation (LEEBI). Jpn J Appl Phys. 1989;28:L2112-4.

Bour et al., AlGaInN MQW Laser Diodes. III-V Nitride Semiconductors Applications and Devices. E.T. Yu (Ed.). Taylor and Francis Books, Inc., New York, NY, vol. 16, Chapter 10. 2003.

Bour et al., Design and performance of asymmetric waveguide nitride laser diodes. IEEE J Quantum Electron. 2000;36(2):184-191. doi: 10.1109/3.823464.

Chen et al., High reflectance membrane-based distributed Bragg reflectors for GaN photonics. Appl Phys Lett. 2012;101:221104.1-4.

Chen et al., Flexible, Compliant GaN Nanomembranes for Photonic Applications. 10th International Conference on Nitride Semiconductors. Abstract. Aug. 25, 2013. 2 pages.

Chen et al., Nanopores in GaN by electrochemical anodization in hydrofluoric acid: Formatio and mechanism. J Appl Physics. 2012;112:064303.1-5.

Choquette et al., Selective Oxidation of Buried AlGaAs for Fabrication of Vertical-Cavity Lasers. Conference: Spring meeting of the Materials Research Society (MRS), San Francisco, CA, Apr. 8-12, 1996. OSTI 244633. Jun. 1996 10 pages.

Chung et al., Effect of Oxygen on the Activation of Mg Acceptor in GaN Epilayers Grown by Metalorganic Chemical Vapor Deposition. Jpn J Appl Phys. 2000;39(1,8):4749-50.

Dorsaz et al., Selective oxidation of AllnN layers for current confinement in Ill-nitride devices. Appl Phys Lett. 2005;87:072102. 1-3.

Eiting et al., Growth of low resistivity p-type GaN by metal organic chemical vapour deposition. Electron Lett. Nov. 6, 1997;33(23):1987-1989. doi: 10.1049/el.19971257.

Higuchi et al., Room-temperature CW lasing of a GaN-based vervical-cavity surface-emitting laser by current injection. Appl Phys Express. 2008;1(12):121102.1-3.

Holder et al., Demonstration of nonpolar GaN-based vertical-cavity surface-emitting lasers. Proc SPIE. Mar. 13, 2013;8639:863906.1-10. doi: 10.1117/12.2008277.

Jeon et al., Investigation of Mg doping in high-Al content p-type Al x Ga 1-x N (0.3<x<0.5). Appl Phys Lett. 2005;86:082107.1-3. doi: 10.1063/1.1867565.

Jiang et al., Semiconduct or lasers: Expanding into blue and green. Nat Photon. 2011;5:521-2.

Kamiura et al., Photo-Enhanced Activation of Hydrogen-Passivated Magnesium in P-Type GaN Films. Jpn J Appl Phys. 1998;37(2,8B):L970-1.

Kasahara et al., Demonstration of blue and green GaN based vertical cavity surface emitting lasers by current injection at room temperature. Appl Phys Express. 2011;4:072103.1-3.

Kiefer et al., Si/Ge junctions formed by nanomembrane bonding. ACS Nano. Feb. 22, 2011;5(2):1179-89. doi: 10.1021/nn103149c. Epub Jan. 19, 2011. 11 pages.

Kim et al., Reactivation of Mg acceptor in Mg-doped GaN by nitrogen plasma treatment. Appl Phys Lett. May 22, 2000;76(21):3079-81.

Kozodoy et al., Enhanced Mg doping efficiency in Al 0.2 Ga 0.8 N/GaN superlattices. Appl Phys Lett. Jan. 14, 1999;74(24):3681-3. doi: 10.1063/1.123220.

Krishnamoorthy et al., InGaN/GaN tunnel junctions for hole injection in GaN light emitting diodes. Appl Phys Lett. Jun. 10, 2014;105(14):141104. doi: 10.1063/1.4897342. 16 pages.

Kurokawa et al., Multijunction GaInN-based solar cells using a tunnel junction. Appl Phys Express. Mar. 3, 2014;7(3):034104.1-4.

Kuwano et al., Lateral Hydrogen Diffusion at p-GaN Layers in Nitride-Based Light Emitting Diodes with Tunnel Junctions. Jpn J Appl Phys. Aug. 20, 2013;52(8S):08JK12.1-3.

Laino et al., Substrate Modes of (Al,In)GaN Semiconductor Laser Diodes on SiC and GaN Substrates. IEEE J Quantum Electron. 2007;43(1):16-24. doi: 10.1109/JQE.2006.884769.

Lin et al., Current steering effect of GaN nanoporous structure. Thin Solid Films. Nov. 2014;570(Part B):293-7.

Lu et al., CW lasing of current injection blue GaN-based vertical cavity surface emitting laser. Appl Phys Lett. 2008;92:141102.1-3.

Myers et al., Diffusion, release, and uptake of hydrogen in magnesium-doped gallium nitride: Theory and experiment. J Appl Phys. Mar. 15, 2001;89(6):3195-202.

Nagahama et al., High-Power and Long-Lifetime InGaN Multi-Quantum-Well Laser Diodes Grown on Low-Dislocation-Density GaN Substrates. Jpn J Appl Phys. 2000;39, part 2(7a):L647-50. doi: 10.1143/JJAP.39.L647.

Nakamura et al., Hole Compensation Mechanism of P-Type GaN Films. Jpn J Appl Phys. May 1992;31(1,5A):1258-66.

Nakamura et al., The Blue Laser Diode: The Complete Story. Springer. 2000. pp. 24-28, 237-9.

Nakayama et al., Electrical Transport Properties of p-GaN. Jpn J Appl Phys. 1996;35, Part 2(3A):L282-4. doi: 10.1143/JJAP.35.L282.

Okamoto et al., Pure Blue Laser Diodes Based on Nonpolar m-Plane Gallium Nitride with InGaN Waveguiding Layers. Jpn J Appl Phys. 2007;46:L820-2. doi: 10.1143/JJAP.46.L820.

Paskiewicz et al., Defect-free single-crystal SiGe: a new material from nanomembrane strain engineering. ACS Nano. Jul. 26, 2011;5(7):5814-22. doi: 10.1021/nn201547k. Epub Jun. 16, 2011.

Piprek, Blue light emitting diode exceeding 100% quantum efficiency. Phys Status Solidi RRL. Feb. 4, 2014;8(5):424-6. doi: 10.1002/pssr.201409027.

Piprek, Efficiency droop in nitride-based light-emitting diodes. Physica Status Solidi A. Oct. 2010;207(10):2217-25.

Pourhashemi et al., High-power blue laser diodes with indium tin oxide cladding on semipolar (202̄ 1̄ ) GaN substrates. Appl Phys Lett. 2015;106:111105.1-4.

Rogers et al., Synthesis, assembly and applications of semiconductor nanomembranes. Nature. Aug. 31, 2011;477(7362):45-53. doi: 10.1038/nature10381.

Ruoyuan et al., Wet oxidation of AlGaAs/GaAs distributed Bragg reflectors. Chin J Semiconductors. Aug. 2005;26(8):1519-23.

Sarzynski et al., Elimination of AlGaN epilayer cracking by spatially patterned AlN mask. Appl Phys Lett. 2006;88:121124.1-3.

Someya et al., Room temperature lasing at blue wavelengths in gallium nitride microcavities. Science. Sep. 17, 1999;285(5435):1905-6.

Sundararajan et al., Gallium nitride: Method of defect characterization by wet oxidation in an oxalic acid electrolytic cell. J Vac Sci Tech B. Sep. 27, 2002;20(4):1339-41.

Tanaka et al., p-type conduction in Mg-doped GaN and Al0.08Ga0.92N grown by metalorganic vapor phase epitaxy. Appl Phys Lett. 1994;65:593-4. doi: 10.1063/1.112309.

Todt et al., Oxidation kinetics and microstructure of wet-oxidized MBE-grown short-period AlGaAs superlattices. Mat Res Soc Symp Proc. 2002;692:561-6.

Waldrip et al., Stress engineering during metalorganic chemical vapor deposition of AlGaN/GaN distributed Bragg Reflectors. Appl Phys Lett. May 21, 2001;78(21):3205-7.

(56) References Cited

OTHER PUBLICATIONS

Wierer et al., Comparison between blue lasers and light-emitting diodes for future solid-state lighting. Laser Photonics Rev. Nov. 2013;7(6):963-93.
Yam et al., Structural and optical characteristics of porus GaN generated by electroless chemical etching. Mater Lett. 2008;63:724-7.
Yerino et al., Shape transformation of nanoporous GaN by annealing: From buried cavities to nanomembranes. Appl Phys Lett. Jun. 2011;98(25):251910.1-3. doi: 10.1063/1.3601861.
Zhang et al., A conductivity-based selective etching for next generation GaN devices. Physica Status Solidi B. Jul. 2010;247(7):1713-6. doi: 10.1002/pssb.200983650.
Zhang et al., Confinement factor and absorption loss of AlInGaN based laser diodes emitting from ultraviolet to green. J Appl Phys. 2009;105:023104.1-8.
Zhang et al., Mesoporous GaN for Photonic Engineering—Highly Reflective GaN Mirrors as an Example. ACS Photonics. 2015;2(7):980-6.
Zheng et al., Synthesis of Ultra-Long and Highly Oriented Silicon Oxide Nanowires from Liquid Alloys. Adv Mater. Jan. 2002;14(2):122-4.
Zhou et al., Near ultraviolet optically pumped vertical cavity laser. Electron Lett. Oct. 12, 2000;36(21):1777-9.
International Preliminary Report on Patentability dated Apr. 13, 2017 for PCT/US2015/053254.
International Search Report and Written Opinion dated Apr. 8, 2011 for Application No. PCT/US2011/22701.
International Search Report and Written Opinion dated Oct. 29, 2013 for Application No. PCT/US2013/046852.
International Search Report and Written Opinion dated Aug. 25, 2016 for PCT/US2016/033270.
Extended European Search Report dated Oct. 12, 2017 for Application No. 11737629.3.
Extended European Search Report for Application No. EP 15846362.0 dated Apr. 24, 2018.
Gautier et al., Observations of Macroporous Gallium Nitride Electrochemically Etched from High Doped Single Crystal Wafers in HF Based Electrolytes. ECS J. of Solid State Science and Tehcnology. 2013;2(4):P146-8.
Park et al., Doping selective lateral electrochemical etching of GaN for chemical lift-off. Jun. 5, 2009. Applied Physics Letters. AIP Publishing LLC, US. vol. 94(22) pp. 221907-1-221907-3.
Vajpeyi et al., High Optical Quality Nanoporous GaN Prepared by Photoelectrochemical Etching. Electrochemical and Solid-State Letters. 2005;8(4):G85-8.
Yam et al., Porous GaN prepared by UV assisted electrochemical etching. Thin Solid Films. Elsevier, Amsterdam, NL, Feb. 15, 2007; vol. 515(7-8), pp. 3469-3474.
International Preliminary Report on Patentability for International Application No. PCT/US2013/046852, dated Jan. 8, 2015.
International Preliminary Report on Patentability, dated Aug. 9, 2012 for Application No. PCT/US2011/022701.
Extended European Search Report for European Application No. 16797298.3, dated Dec. 3, 2018.
International Preliminary Report on Patentability for International Application No. PCT/US2016/033270, dated Nov. 30, 2017.
Bernardini et al., Spontaneous polarization and piezoelectric constants of III-V nitrides. Phys. Rev. B. 1997;56(16):R10024-7.
Pandey et al., Formation of self-organized nanoporous anodic oxide from metallic gallium. Langmuir. 2012;28(38):13705-11.
Park et al., High Diffuse Reflectivity of Nanoporous GaN Distributed Bragg Reflector Formed by Electrochemical Etching. Applied Physics Express. Jun. 14, 2013. 14;6(7):072201-1-4.
Al-Heuseen et al., Effect of different electrolytes on porous GaN using photo-electrochemical etching. Applied surface science. May 1, 2011;257(14):6197-201.
Amano et al., I. P-type conduction in Mg-doped GaN treated with low-energy electron beam irradiation (LEEBI). Japanese Journal of Applied Physics. Dec. 1989;28(12A):L2112.

Beale et al., An experimental and theoretical study of the formation and microstructure of porous silicon. Journal of Crystal Growth. Dec. 1, 1985;73(3):622-36.
Beale et al., Microstructure and formation mechanism of porous silicon. Applied Physics Letters. Jan. 1, 1985;46(1):86-8.
Bisi et al., Porous silicon: a quantum sponge structure for silicon based optoelectronics. Surface science reports. Apr. 1, 2000;38(1-3):1-126.
Chen et al., High-Q, Low-Threshold Monolithic Perovskite Thin-Film Vertical-Cavity Lasers. Advanced Materials. Apr. 2017;29(16):1604781.
Chichibu et al., Origin of defect-insensitive emission probability in In-containing (Al, In, Ga) N alloy semiconductors. Nature materials. Oct. 2006;5(10):810-6.
Choquette et al., Vertical-cavity surface emitting lasers: moving from research to manufacturing. Proceedings of the IEEE. Nov. 1997;85(11):1730-9.
Cullis et al., The structural and luminescence properties of porous silicon. Journal of applied physics. Aug. 1, 1997;82(3):909-65.
Davis et al., Ordered porous materials for emerging applications. Nature. Jun. 2002;417(6891):813-21.
Feng et al., Genetic history of Xinjiang's Uyghurs suggests bronze age multiple-way contacts in Eurasia. Molecular Biology and Evolution. Oct. 1, 2017;34(10):2572-82.
Föll et al., Macroporous semiconductors. Materials. May 2010;3(5):3006-76.
Gautier et al., Porous silicon in microelectronics: From academic studies to industry. ECS Transactions. Sep. 18, 2015;69(2):123.
Hamaguchi et al., Milliwatt-class GaN-based blue vertical-cavity surface-emitting lasers fabricated by epitaxial lateral overgrowth. physica status solidi (a). May 2016;213(5):1170-6.
Han et al., Single-Crystalline, Nanoporous Gallium Nitride Films With Fine Tuning of Pore Size for Stem Cell Engineering. Journal of Nanotechnology in Engineering and Medicine. Nov. 1, 2014;5(4):040903-1.
Huang et al., Mechanical properties of nanoporous GaN and its application for separation and transfer of GaN thin films. ACS Applied Materials & Interfaces. Nov. 13, 2013;5(21):11074-9.
Jasim et al., the Size Effect in Small Aperture Confined Vertical Cavity Surface Emitting Laser. AIP Conference Proceedings. Jun. 1, 2009;1136(1):103-7.
Kuramoto et al., Enhancement of slope efficiency and output power in GaN-based vertical-cavity surface-emitting lasers with a SiO2-buried lateral index guide. Applied Physics Letters. Mar. 12, 2018;112(11):111104.
Kuwano et al., Lateral hydrogen diffusion at p-GaN layers in nitride-based light emitting diodes with tunnel junctions. Japanese Journal of Applied Physics. Aug. 20, 2013;52(8S):08JK12.
Langa et al., Waveguide structures based on porous indium phosphide. Electrochemical and Solid State Letters. Dec. 23, 2004;8(2):C30.
Lee et al., Enhanced performance of InGaN/GaN multiple-quantum-well light-emitting diodes grown on nanoporous GaN layers. Optics Express. Jun. 30, 2014;22(104):A1164-73.
Lee et al., Fast fabrication of long-range ordered porous alumina membranes by hard anodization. Nature materials. Sep. 2006;5(9):741-7.
Lee et al., Optically pumped GaN vertical cavity surface emitting laser with high index-contrast nanoporous distributed Bragg reflector. Optics express. May 4, 2015;23(9):11023-30.
Lin et al., Fabrication of current confinement aperture structure by transforming a conductive GaN: Si epitaxial layer into an insulating GaOx layer. ACS Applied Materials & Interfaces. Dec. 24, 2014;6(24):22235-42.
Mynbaeva et al., Strain relaxation in GaN layers grown on porous GaN sublayers. Materials Research Society Internet Journal of Nitride Semiconductor Research. 1999;4(1).
Mynbaeva et al., Structural characterization and strain relaxation in porous GaN layers. Applied Physics Letters. Feb. 28, 2000;76(9):1113-5.
Schwab et al., Aligned mesopore arrays in GaN by anodic etching and photoelectrochemical surface etching. The Journal of Physical Chemistry C. Aug. 22, 2013;117(33):16890-5.

(56) References Cited

OTHER PUBLICATIONS

Searson et al., Pore morphology and the mechanism of pore formation in n-type silicon. Journal of applied physics. Jul. 1, 1992;72(1):253-8.
Sharizal et al., Effect of oxide aperture on the performance of 850 nm vertical-cavity surface-emitting lasers. Optik. Jan. 1, 2009;120(3):121-6.
Smith et al., A theoretical model of the formation morphologies of porous silicon. Journal of Electronic Materials. Nov. 1, 1988;17(6):533-41.
Smith et al., Porous silicon formation mechanisms. Journal of Applied Physics. Apr. 15, 1992;71(8):R1-22.
Wang et al., Fabrication and properties of nanoporous GaN films. Applied physics letters. Aug. 2, 2004;85(5):816-8.
Yang et al., Improving light output power of InGaN-based light emitting diodes with pattern-nanoporous p-type GaN: Mg surfaces. Applied Physics Letters. Nov. 17, 2008;93(20):203103.
Yuan et al., Optical engineering of modal gain in a III-nitride laser with nanoporous GaN. ACS Photonics. Sep. 21, 2016;3(9):1604-10.
Zhang et al., a resonant-cavity blue—violet light-emitting diode with conductive nanoporous distributed Bragg reflector. physica status solidi (a). Aug. 2017;214(8):1600866.
Zhang et al., Toward quantitative electrochemical nanomachining of III-nitrides. Journal of The Electrochemical Society. Jul. 28, 2018;165(10):E513-20.
Zhang, Mechanism of pore formation on n-type silicon. Journal of the Electrochemical Society. Dec. 1, 1991;138(12):3750-6.
Zhang, Nanoporous GaN and Its Application in Vertical-Cavity Surface-Emitting Lasers. Yale University PhD Dissertation. May 2019:248 pp.

\* cited by examiner

METHOD FOR GAN VERTICAL MICROCAVITY SURFACE EMITTING LASER (VCSEL)

CROSS-REFERENCE TO RELATED APPLICATIONS

This application is a national stage application of PCT/US2015/053254 titled "A Method for GaN Vertical Microcavity Surface Emitting Laser (VSCEL)," filed on Sep. 30, 2015, which claims the benefit of U.S. provisional application Ser. No. 62/057,543 titled "A Method for GaN Vertical Microcavity Surface Emitting Laser (VSCEL)," filed on Sep. 30, 2014. The entire contents of these applications are incorporated herein by reference in their entirety.

BACKGROUND

Technical Field

The technology relates to forming nanoporous gallium-nitride materials. The porous gallium nitride may be used in integrated optical devices such as vertical-cavity surface-emitting lasers and light-emitting diodes.

Discussion of the Related Art

The etching of semiconductor materials is an important technique that is used in microfabrication processes. Various kinds of etching recipes have been developed for many materials used in semiconductor manufacturing. For example, Si and certain oxides may be etched using dry (e.g., reactive-ion etching) or wet chemical etching techniques that yield desired etch rates and etch morphologies. III-nitride materials, such as gallium nitride (GaN) and its alloys, have recently emerged as attractive materials for some semiconductor applications, because of the material's physical and electronic properties.

Some desirable uses for III-nitride materials include micro-photonic devices, such as light-emitting diodes (LEDs) and semiconductor lasers for various lighting applications. Because of its wide band gap, GaN-based devices can produce light in the blue region of the visible spectrum and can therefore be used in the production of white light. One type of semiconductor light-emitting device that offers some advantages in terms of manufacturability and performance is the vertical cavity surface emitting laser (VCSEL).

A vertical cavity surface emitting laser is a class of semiconductor lasers that was conceptualized and developed during the 1980's and 1990's. A general structure of a VCSEL is depicted in FIG. 1. VCSELs are unlike early semiconductor laser diodes, known as edge-emitting laser diodes, for which the direction of the laser cavity and the direction of the lasing beam are parallel to the planar surface of the semiconductor substrate. For edge-emitting lasers, the laser light travels transverse to the direction of the laser's semiconductor junction, and emits from an edge of the chip. In contrast for a VCSEL 100, the laser cavity 170 and emitting laser beam 175 are oriented perpendicular to the planar surface of the substrate 105 on which the VCSEL is fabricated, and the laser beam travels in a direction of the p-n junction.

Compared with conventional edge-emitting laser diodes, a VCSEL 100 has several advantages that include (1) on-wafer testing of device performance, (2) better beam profile and far-field patterns, (3) better mode stability and wider free spectral range, (4) possibility of a very low threshold current, (5) a generally higher manufacturing yield, (6) a higher packing density and therefore lower cost, and (7) improved compatibility with planar microfabrication processes. VCSELs in the infrared and red spectral ranges are currently being used for telecommunication and industrial applications.

SUMMARY

The described technology relates to methods and structures associated with forming uniform, nanoporous layers in gallium-nitride semiconductor materials. According to some embodiments, the nanoporous layers may be used for forming integrated, optically-reflective structures such as distributed Bragg reflector (DBR) structures. The nanoporous layers may be formed using electrochemical (EC) etching techniques at room temperature. The EC etching does not require ultraviolet or optical illumination to etch the gallium-nitride material. The inventors have found that the pore morphology and uniformity of the etching process depends on several parameters (e.g., material doping, material composition, applied bias, etchant or electrolyte composition and concentration, and current spreading at the region to be etched). Highly reflective DBR structures, suitable for use in VCSELs, have been fabricated using the described technology.

According to some embodiments, a porous gallium-nitride layer, fabricated according to the present embodiments, may have a majority of its pores with a maximum transverse width less than approximately 100 nm and have a volumetric porosity greater than 30%. In some aspects, more than 90% of the pores of the porous gallium-nitride layer have a maximum transverse width less than approximately 100 nm. In some aspects, over half of the pores of the gallium-nitride layer may have a maximum transverse width between approximately 30 nm and approximately 90 nm. In some aspects, more than 70% of the pores of the gallium-nitride layer have a maximum transverse width between approximately 30 nm and approximately 90 nm. According to some aspects, the pores have walls with a root-mean-square surface roughness less than approximately 10 nm.

According to some implementations, an n-type doping density of the porous gallium-nitride layer is between approximately $5 \times 10^{19}$ cm$^{-3}$ and approximately $2 \times 10^{20}$ cm$^{-3}$. In some aspects, a dopant in the porous gallium-nitride layer for the n-type doping is germanium. In some implementations, the volumetric porosity of the porous gallium-nitride layer is greater than 60%.

In some implementations, a porous gallium-nitride layer having any of the foregoing characteristics may be included in a distributed Bragg reflector. In some aspects, a porous gallium-nitride layer having any of the foregoing characteristics may be included in a vertical-cavity surface-emitting laser. In some aspects, a porous gallium-nitride layer having any of the foregoing characteristics may be included in a light-emitting diode. According to some implementations, a porous gallium-nitride layer having any of the foregoing characteristics may be included in an electrode.

In some embodiments, a semiconductor light emitting device may comprise at least one buried porous gallium-nitride layer wherein a majority of the pores of the at least one buried porous gallium-nitride layer have a maximum transverse width less than approximately 100 nm and the at least one buried porous gallium-nitride layer has a volumetric porosity greater than 30%. In some aspects, over 70% of the pores of the at least one buried porous gallium-nitride layer have a maximum transverse width between approximately 30 nm and approximately 90 nm.

According to some implementations, the at least one buried porous gallium-nitride layer comprises a plurality of porous gallium-nitride layers separated by non-porous gallium-nitride layers arranged in a first distributed Bragg reflector (DBR). The plurality of porous gallium-nitride layers may include non-porous regions located centrally within the DBR that form a pillar of non-porous gallium nitride. In some implementations, the first DBR is arranged as an n-side reflector for a vertical-cavity surface-emitting laser (VCSEL). In some aspects, the first DBR has a reflectance greater than 99% for a lasing wavelength of the VCSEL. In some implementations, the first DBR has reflectance values greater than 98% over a bandwidth greater than approximately 20 nm. In some aspects, the pores of the at least one buried porous gallium-nitride layer have walls with a root-mean-square surface roughness less than approximately 10 nm. In some implementations, the at least one buried porous gallium-nitride layer has an n-type doping density between approximately $5\times10^{19}$ cm$^{-3}$ and approximately $2\times10^{20}$ cm$^{-3}$. According to some aspects, a dopant for the n-type doping in the at least one buried porous gallium-nitride layer is germanium.

According to some implementations, a semiconductor light emitting device may further include a cavity region having a length L and a second DBR, wherein the cavity region is located between the first DBR and the second DBR. In some aspects, the cavity region includes multiple quantum wells or a superlattice. According to some implementations, the length L of the cavity region is between approximately one and five optical wavelengths of a lasing wavelength for the VCSEL. In some implementations, a semiconductor light emitting device may further comprise a current-spreading layer having a doping density greater than $1\times10^{18}$ cm$^{-3}$ located adjacent to the distributed Bragg reflector.

Also described are method embodiments that may be used to fabricate one or more of the foregoing structures or devices. According to some embodiments, a method for forming porous gallium nitride may comprise acts of exposing heavily-doped gallium nitride to an etchant, wherein the heavily-doped gallium nitride has an n-type doping density between approximately $5\times10^{19}$ cm$^{-3}$ and approximately $2\times10^{20}$ cm$^{-3}$, applying an electrical bias between the etchant and the heavily-doped gallium nitride, wherein the electrical bias has a value between approximately 1.3 volts and 3 volts, and electrochemically etching the heavily-doped gallium nitride to produce porous gallium nitride having a volumetric porosity greater than approximately 30% and a majority of pores with a maximum transverse width less than approximately 100 nm.

In some implementations, over 70% of the pores of the etched gallium nitride have a maximum transverse width between approximately 30 nm and approximately 90 nm. In some aspects, the electrochemical etching does not require illumination of the heavily-doped gallium nitride. According to some implementations, a dopant for the heavily-doped gallium nitride is germanium. In some implementations, the etchant comprises nitric acid having a concentration between 60% and approximately 80% by weight. In some aspects, the etchant comprises nitric acid having a concentration of approximately 70% by weight.

According to some implementations of a method for forming porous gallium nitride, the heavily-doped gallium nitride may be arranged in a plurality of layers that are separated by undoped gallium-nitride layers. A method may further comprise spreading etching current during the electrochemical etching with a current-spreading layer of doped gallium nitride located adjacent to the DBR. A method may further comprise etching vias into the plurality of layers and the undoped gallium-nitride layers to expose edges of the plurality of layers. In some aspects, the electrochemical etching comprises lateral etching of the plurality of layers.

According to some aspects, a method for forming porous gallium nitride may further include depositing the plurality of layers and the undoped or moderately-doped gallium-nitride layers to form a first distributed Bragg reflector (DBR) for a vertical-cavity surface-emitting laser (VCSEL). A method may further comprise stopping the electrochemical etching to leave a pillar of unetched gallium nitride centrally within the first DBR. In some aspects, a method may further comprise forming a cavity region having multiple quantum wells or a superlattice adjacent to the first DBR. In some implementations, a method for forming porous gallium nitride may further comprise forming a second DBR on an opposite side of the cavity region from the first DBR.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. In the drawings, like reference characters generally refer to like features, functionally similar and/or structurally similar elements throughout the various figures. The drawings are not necessarily to scale, emphasis instead being placed upon illustrating the principles of the teachings. Directional references ("above," "top," "on," "below," etc.) made in connection with the drawings are for illustration purposes only. Structures may be fabricated in orientations other than those depicted in the drawings. Where the drawings relate to microfabrication of integrated devices, only one device may be shown of a large plurality of devices that may be fabricated in parallel on a same substrate. The drawings are not intended to limit the scope of the present teachings in any way.

The features and advantages of the embodiments will become more apparent from the detailed description set forth below when taken in conjunction with the drawings.

DETAILED DESCRIPTION

Nanoporous semiconductor has several useful applications in the field of semiconductor technology. These applications include, but are not limited to, stress-relief layers for heteroepitaxy, oxidation-conversion layers, electrodes with high surface areas, and multilayer reflective structures. With regard to this last application, the inventors have recognized and appreciated that nanoporous gallium nitride materials can be very useful for improving performance of light-emitting devices such as light-emitting diodes (LEDs) and vertical cavity surface emitting lasers (VCSELs). Efficient LEDs and VCSELs are useful for high-end lighting applications such as automobile headlights, micro-projectors, displays, and low-droop, high-power lamps.

As described further below, the inventors have conceived and developed techniques for forming highly uniform, nanoporous gallium-nitride layers for light-emitting devices using electrochemical (EC) etching at room temperature. The inventors have recognized and appreciated that high porosity, high uniformity, small pore size, and smooth wall surfaces can improve the optical performance of reflective structures that incorporate such porous layers. To obtain high uniformity, high porosity, small pore size, and smooth wall surfaces in GaN, the inventors investigated a wide range of etching conditions and material modifications. The inventors have discovered that a desirable pore morphology can be obtained with EC etching under limited etching conditions and material composition.

Figure 1:
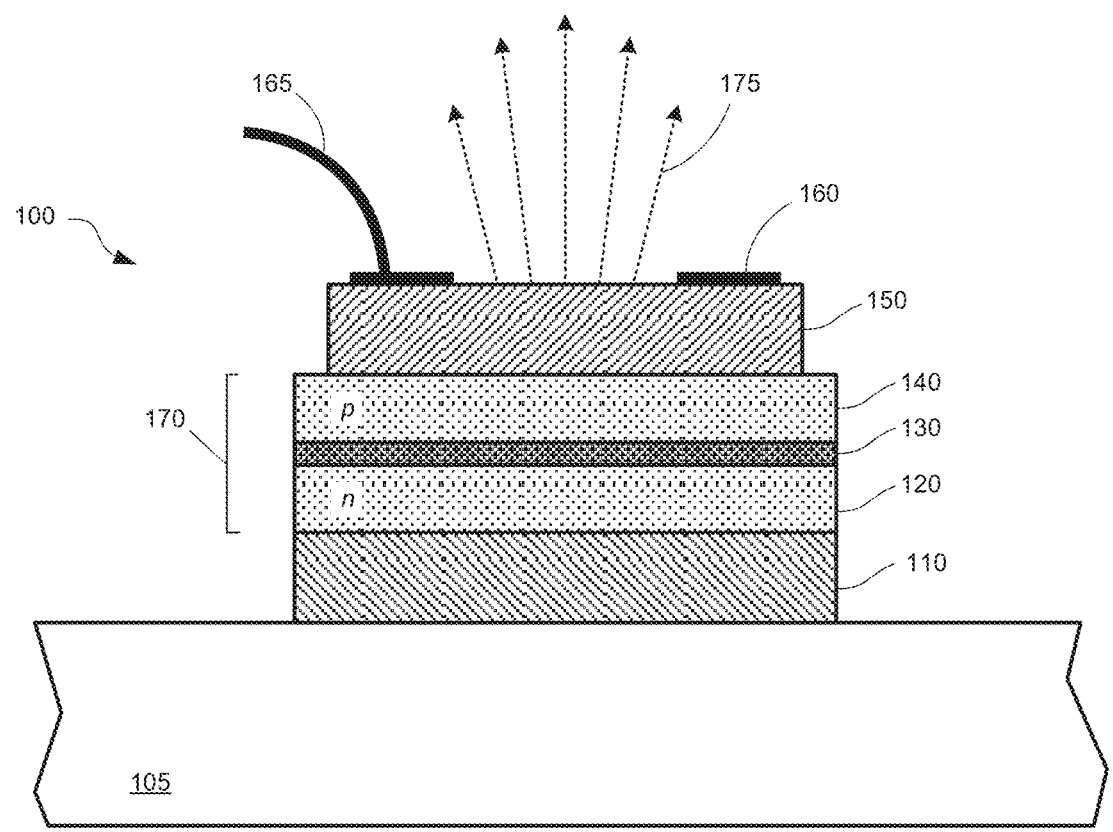
FIG. 1 is a simplified depiction of a vertical cavity surface-emitting laser (VCSEL), according to some embodiments.

Referring again to FIG. 1 and in overview, a VCSEL may include an active region 130 located between a first semiconductor layer 140 of a first conductivity type (e.g., p-type) and a second semiconductor layer 120 of a second conductivity type (e.g., n-type). The active region 130 may comprise multiple-quantum-well (MQW) layers or a superlattice (SL). The laser cavity 170 of the VCSEL may include the active region and adjacent layers, and may be located between a first bottom-side reflector 110 and a second top-side reflector 150. In some cases, the bottom side of the device may be the n-conductivity side, and the top side of the device may be the p-conductivity side. Electrical contact to the VCSEL 100 may be made through the substrate 105 on the bottom side and through a deposited conductive contact 160 on the top side of the device. The top-side contact may connect to an external current or voltage source through one or more wire bonds 165. When current is applied to the VCSEL 100, electrons and holes recombine in the active region 130 to produce photons. The photons travel back and forth between the reflectors 110, 150 and may be amplified by stimulated emission. A portion of the circulating photons are transmitted through the top-side reflector 150 to produce the laser beam 175.

To date, there have been a few demonstrations of III-nitride VCSELs, because of technical challenges in fabricating a working device. These challenges include (1) forming an efficient active region 130 for carrier-to-photon conversion, (2) fabricating high-quality planar reflectors 110, 150 for the laser cavity 170, and (3) controlling spatial current flow through the active region 130 such that photons produced by carrier recombination will overlap efficiently with optical laser-cavity modes. Although the technology relating to the active region 130 is reasonably mature, the mirror technology (item 2) continues to pose a challenge. Two teams (one at Tokyo University and a joint effort by Sandia Labs and Brown University) separately demonstrated the use of solid epitaxial AlGaN/GaN layer pairs in a distributed Bragg reflector (DBR) as the bottom-side reflector 110, and used a dielectric oxide stack as the top-side reflector 150 above the active region 130. This hybrid configuration of dielectric-epitaxial reflectors was further developed by NCTU in Taiwan, leading to the first demonstration of an electrically-injected III-nitride VCSEL in 2008.

Conventional preparation of a bottom-side DBR 110 by epitaxy, however, can be exceedingly difficult. A large number (40 to 60) of AlGaN/GaN layer pairs having stringent thickness tolerances are typically required to achieve a high reflectivity (R~99%) due to the low contrast of index of refraction between AlGaN and GaN. Additionally, the large number of dissimilar layers can develop appreciable strain in the DBR, which can pose fabrication challenges and degrade device performance. Finally, the resulting AlGaN/GaN epitaxial mirror has a narrow bandwidth ($\Delta\lambda$~15 nm). These aspects of an AlGaN/GaN DBR can make optical mode-matching with a laser cavity mode a significant challenge.

In an effort to avoid the complexity associated with DBR mirrors, Nichia Chemical used a laser lift-off (LLO) technique to separate an InGaN/GaN p-n epitaxial structure having a top-side dielectric reflector from a sapphire substrate, and to expose the bottom side (n-side) for the deposition of another dielectric mirror. In this case, the use of LLO adds processing complexity and essentially voids an advantage of on-wafer testing for VCSELs. Also, the LLO process typically needs a relatively thick active region, which increases the laser cavity length and reduces the optical mode spacing. Reduced mode spacing can make it more difficult to obtain single-mode operation or to match a wavelength of a laser cavity mode with the wavelength for which the laser's DBRs are designed. Although Nichia and NCTU used dielectric current blocking layers on the p-side, these research groups did not demonstrate current blocking on the n-side where lateral current diffusion could seriously degrade the VCSEL's performance.

Figure 2:
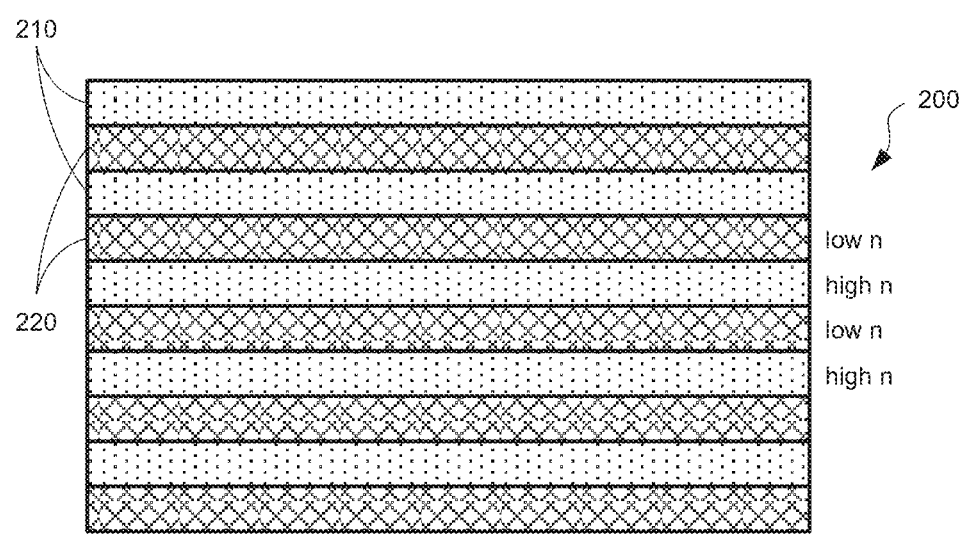
FIG. 2 depicts a distributed Bragg reflector that includes porous layers, according to some embodiments.

To overcome some of the difficulties associated with DBR fabrication, the inventors have proposed forming nanoporous/non-porous gallium-nitride layer pairs, as depicted in FIG. 2. The structure may comprise nanoporous layers 220 interleaved with non-porous layers 210, where each layer corresponds to a quarter wavelength of the central lasing wavelength for the VCSEL, according to some embodiments. The nanoporous layers 220 can have a low refractive index n compared to the non-porous layers, giving a significantly higher refractive index contrast than is possible for solid InGaN/GaN layer pairs. The inventors have recognized and appreciated that a high reflectivity can be achieved with a reduced number of layer pairs (e.g., 6-20) provided the volumetric porosity (ratio of air volume in a porous layer to total volume of the porous layer) is high. The inventors have also recognized that the optical quality of the reflector will be improved if the pore size is small (less than one-quarter the lasing wavelength), the porosity is uniform across the device, and the pores have smooth walls.

Because III-nitride materials can be chemically inert to wet etchants, microfabrication of integrated optical or integrated electronic devices based on these materials poses manufacturing challenges. Although some etching techniques (e.g., dry reactive-ion etching or photoelectrochemical (PEC) etching) have been developed to etch these materials, these processes can be costly and/or difficult to implement. In some cases, these processes may not be useable for DBR structures or structures where a buried porous layer is desired. For example, PEC etching may produce non-uniform etching due to spatial intensity variations, and may not be able to etch buried layers or shadowed regions of a substrate.

The inventors have conceived of electrochemical (EC) etching processes (illumination not required) that can be implemented at room temperature and provide uniform etching of highly porous (e.g., greater than 60% volumetric porosity) buried layers with sub-100-nm pore sizes and smooth wall surfaces. Buried layers may be laterally etched over distances greater than 50 microns. Several etching parameters and material properties are controlled to obtain a desired pore morphology. The EC etching processes may be used to selectively etch gallium-nitride materials that have been doped to tune, in part, the etching properties of the materials. According to some embodiments, a very high doping level and low etching bias is used to obtain a desired pore morphology for gallium-nitride materials. In some implementations, germanium is used as an n-type dopant for GaN to obtain the high level of doping and smooth etched surfaces. According to some implementations, the level of doping may be between approximately $5 \times 10^{19}$ cm$^{-3}$ and approximately $2 \times 10^{20}$ cm$^{-3}$.

The terms "approximately" and "about" may be used to mean within ±20% of a target value (e.g., an explicitly stated value) in some embodiments, within ±10% of a target value in some embodiments, within ±5% of a target value in some embodiments, and yet within ±2% of a target value in some embodiments. The terms "approximately" and "about" also include the target value, so that a ranges expressed as "between approximately A and approximately B" may also be expressed as "between A and B" and a value stated as "approximately A" may also be expressed as "A".

Figure 3:
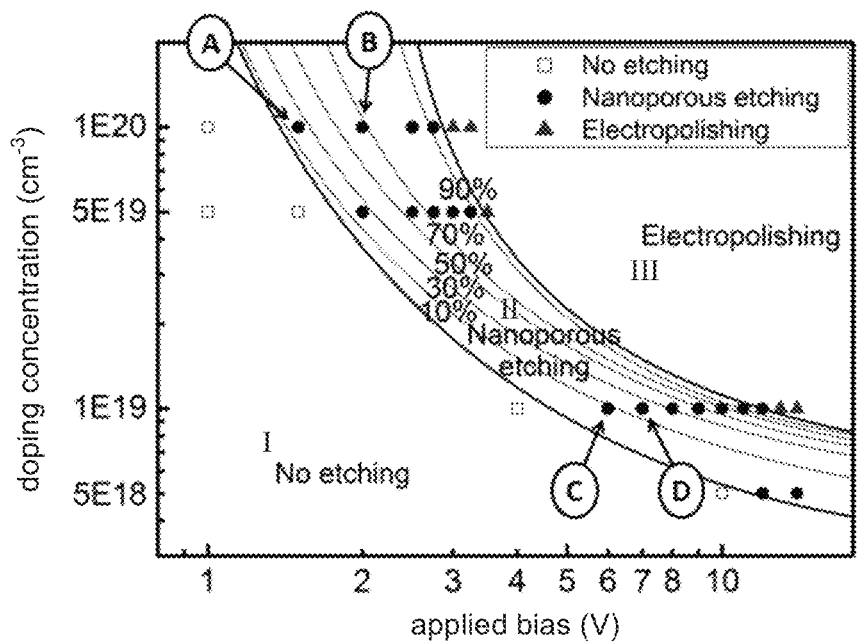
FIG. 3 illustrates etching characteristics of GaN under various etching conditions.

Following extensive research, etching characteristics were mapped by the inventors and are illustrated in the graph of FIG. 3. Pore morphologies corresponding to some of the etched samples are depicted in the scanning-electron micrographs of FIGS. 4A-4D. The etching involved lateral etching of alternate layers in a stack of GaN layers. Improved results were found when highly concentrated nitric acid was used as the electrolyte or etchant. In some implementations, the concentration of nitric acid ($HNO_3$) in water is between approximately 60% and approximately 80% by weight. According to some embodiments, the concentration of nitric acid in water is between approximately 65% and approximately 75% by weight. In some implementations, the concentration of nitric acid in water is approximately 70% by weight or approximately 16.7 molar (M). Using such highly concentrated nitric acid, material doping and applied bias were varied to etch the gallium-nitride layers. The doping and applied bias strongly influenced pore morphology.

With reference to FIG. 3, the etching behavior is roughly divided into three regions: no etching (labeled region I), complete etching or electro-polishing (labeled region III), and the formation of nanoporous GaN (labeled region II). Within the nanoporous GaN etching region, etching was characterized by mapping approximate iso-porosity contours from 10% to 90%. At ultrahigh doping levels between approximately $5 \times 10^{19}$ cm$^{-3}$ and approximately $2 \times 10^{20}$ cm$^{-3}$, a volumetric porosity greater than approximately 60% can be obtained at applied bias voltages between approximately 2.0 V and approximately 3 V. In some implementations, a volumetric porosity greater than approximately 30% can be obtained at applied bias voltages between approximately 1.3 V and approximately 3 V. Such low applied bias values are desirable, because a low bias can reduced any parasitic etching that might otherwise occur in other regions of a VCSEL or LED structure. Additionally at the low bias values, the transverse width of the pores is found to be small (e.g., less than approximately 120 nm) and highly uniform. Under some etching conditions, porosities greater than 80% and 90% are obtained. Such high porosity can appreciably lower the effective refractive index of a porous gallium-nitride layer.

Figure 4A:
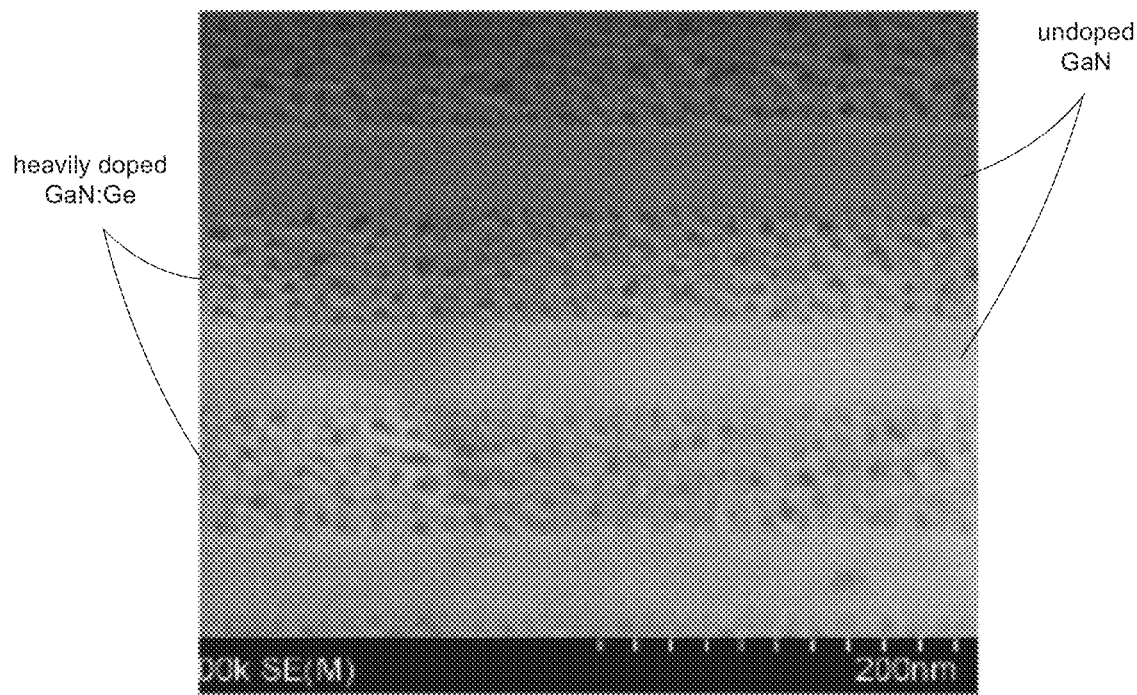
FIG. 4A shows a first pore morphology obtained when etching germanium-doped GaN under first etching conditions.
Figure 4B:
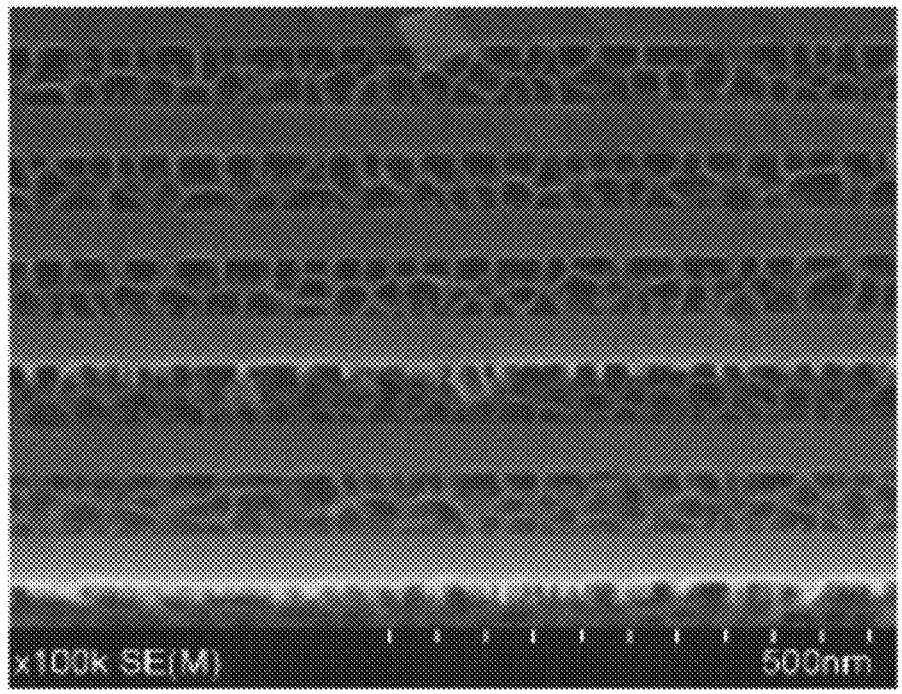
FIG. 4B shows a second pore morphology obtained when etching germanium-doped GaN under second etching conditions.
Figure 4C:
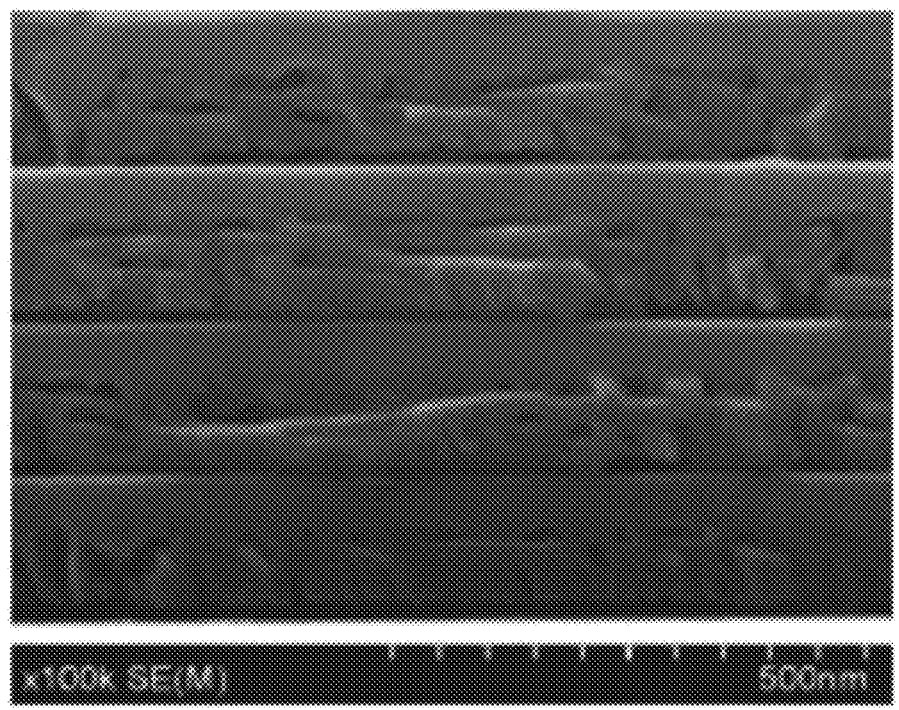
FIG. 4C shows a third pore morphology obtained when etching germanium-doped GaN under third etching conditions.
Figure 4D:
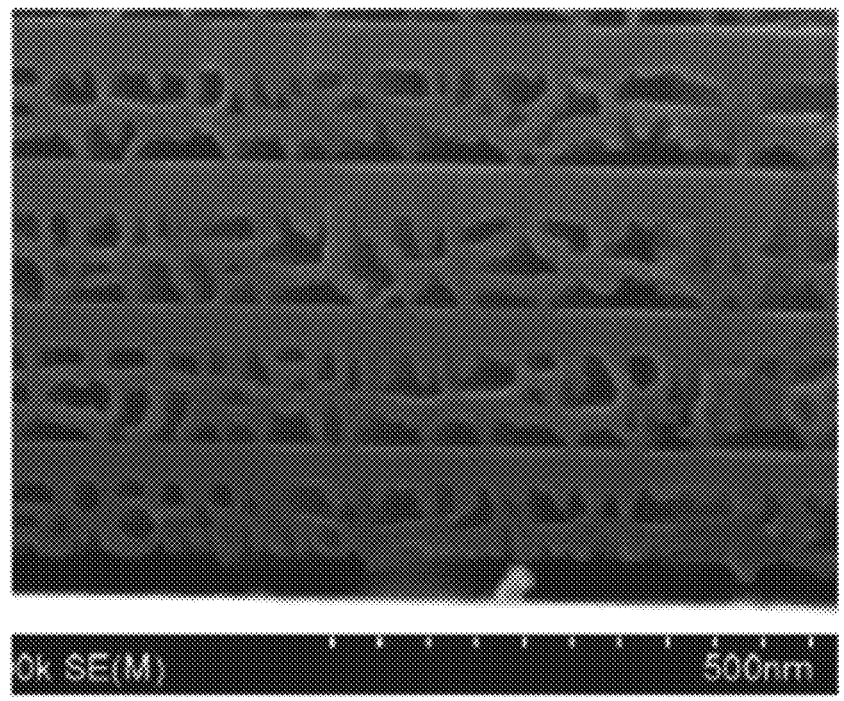
FIG. 4D shows a fourth pore morphology obtained when etching germanium-doped GaN under fourth etching conditions.

Examples of pore morphologies are shown in FIGS. 4A-4D for the four etching conditions indicated by the data points A, B, C, and D in FIG. 3. In FIG. 4A, low volumetric porosity (less than 10%) is obtained in the heavily-doped layers of GaN at low bias values. For the conditions of FIG. 4B, high porosity (greater than 60%) is achieved, and the pore morphology is fairly uniform. The average transverse pore width is less than approximately 100 nm. For the conditions of FIG. 4C and FIG. 4D, the porosity is less than about 30%, and the pore morphology is non-uniform. Some pores have large transverse dimensions (e.g., greater than 150 nm). Large pore sizes can act as scattering centers and degrade the quality of a coherent optical beam and lead to excessive loss in a semiconductor laser. Also, FIG. 4C and FIG. 4D indicate a susceptibility for delamination of the layers. Accordingly, a very high dopant density is preferred for purification of gallium nitride.

Based upon the observed etching characteristics, quality reflective structures may be formed in gallium-nitride materials. For example, one or more porous layers may be formed below an LED to improve light extraction from the LED. Also, a highly-reflective DBR structure may be formed on a substrate for a VCSEL using a plurality of nanoporous layers having high volumetric porosity. Example structures associated with a process for forming a DBR from layers of gallium-nitride materials are depicted in FIGS. 5A-5E.

Figure 5A:
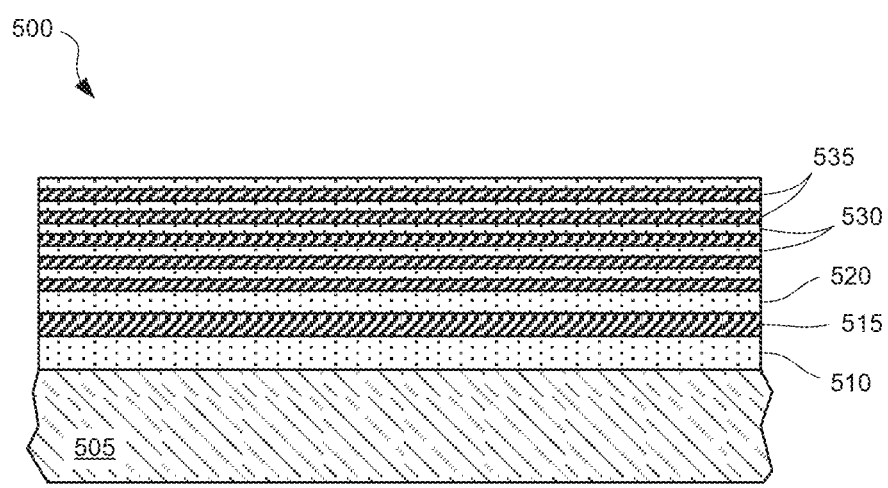
FIG. 5A depicts a multilayer structure that may be used to form a high-reflective, n-side DBR, according to some embodiments.

According to some embodiments, a process for making a DBR may use a multilayer stack 500 formed on a substrate 505, as depicted in FIG. 5A. The substrate may comprise sapphire, gallium nitride, silicon carbide, or any other suitable material upon which gallium nitride may be epitaxially grown. The multilayer stack may include a buffer layer 510 formed on the substrate. The buffer layer may comprise gallium nitride or other III-nitride material and may have a thickness between approximately 500 nm and approximately 2 μm. The buffer layer 510 may be formed using an epitaxial growth process on the substrate 505, and may be undoped in some cases. The buffer layer may be used as a transition layer between the substrate 505 of a first material type and quality gallium-nitride layers formed for the VCSEL (e.g., to relieve stress and reduce defects that arise from a lattice mismatch between the substrate 505 and epitaxially grown gallium-nitride layers of the VCSEL).

The multilayer stack 500 may also include a conductive layer 515 formed of silicon-doped gallium nitride. The conductive layer 515 may be used in some embodiments to carry current to the VCSEL, and may also be used spread current during EC etching while forming porous GaN layers. In some cases, the conductive layer may have a doping density between approximately $1 \times 10^{18}$ cm$^{-3}$ and approximately $1 \times 10^{19}$ cm$^{-3}$. A thickness of the conductive layer 515 may be between approximately 250 nm and approximately 750 nm.

In some embodiments, a DBR structure may further include a layer of undoped gallium nitride 520 that is formed on the conductive layer. The layer of undoped gallium nitride may have a thickness between 250 nm and approximately 750 nm. Above the layer of undoped gallium nitride 520, multiple layer pairs for a DBR may be formed. The layer pairs may be deposited by epitaxial growth, according to some embodiments, and may include undoped or moderately-doped gallium-nitride layers 530 and heavily-doped gallium-nitride layers of 535. A moderately-doped gallium-nitride layer may have a doping density between approximately $1 \times 10^{17}$ cm$^{-3}$ and approximately $2 \times 10^{19}$ cm$^{-3}$. According to some embodiments, there may be 6 to 20 layer pairs of undoped or moderately-doped and heavily-doped gallium-nitride layers in a DBR structure. The layers may be deposited using metal-organic chemical vapor deposition (MOCVD) and/or atomic layer deposition (ALD). The heavily-doped layers 535 may be n-type conductivity (e.g., n++ doping). According to some embodiments the doping density of the heavily-doped gallium-nitride layers may be between approximately $4 \times 10^{19}$ cm$^3$ and approximately $2 \times 10^{20}$ cm$^3$. To achieve such high doping density, the heavily doped layers may be doped with germanium. Whereas silicon doping results in a rough etched surfaces, the inventors discovered that germanium doping allows high doping levels and also results in a smooth surface topology of the etched gallium nitride surfaces for doping levels on the order of $10^{20}$ cm$^{-3}$. With germanium doping, the pore walls (e.g., at an interface with a non-porous layer) have a root-mean-square surface roughness less than approximately 10 nm.

In some implementations, the buffer layer 510, conductive layer 515, undoped layer 520, and/or layer pairs may comprise GaN. In some embodiments, the buffer layer 510, conductive layer 515, undoped layer 520, and/or layer pairs may comprise alloys of gallium nitride. For example, one or more of the layers may include aluminum and/or indium. The term "GaN" is used to refer to a semiconductor composition comprising substantially only Ga and N or doped GaN. The term gallium-nitride may be used to refer to GaN, doped GaN, and alloys or doped alloys of GaN, e.g., InGaN, AlGaN, InAlGaN. The layers may be deposited by one or a combination of deposition techniques, e.g., chemical vapor deposition (CVD), plasma enhanced CVD (PECVD), metal organic CVD (MOCVD), hydride vapor phase epitaxy (HVPE), molecular beam epitaxy (MBE) or atomic layer deposition (ALD), according to some embodiments. According to some embodiments, a deposited layer may be subsequently annealed to improve crystal quality. In some embodiments, additional layers may be deposited that may comprise materials other than gallium nitride or III-nitrides.

According to some embodiments the thicknesses of the undoped or moderately-doped gallium-nitride layers 530 for the DBR may correspond to approximately ¼ wavelength of the VCSEL's designed operating wavelength. The thickness for each undoped or moderately-doped gallium-nitride layer may also correspond to an odd-number multiple of quarter wavelengths, e.g., 3/4, 5/4, 7/4, etc. For example, a thickness $t_1$ of an undoped or moderately-doped gallium-nitride layer in the DBR structure may be determined approximately from the following relation:

$$t_1 \approx \frac{M\lambda_l}{4n}$$

where $\lambda_1$ is the free-space lasing wavelength for the VCSEL, n is the refractive index value for the undoped or moderately-doped gallium-nitride layers at the lasing wavelength, and M=1, 3, 5, . . . . For a VCSEL that is designed to lase in the violet or blue blue region of the spectrum, the thickness of an undoped or moderately-doped gallium-nitride layer 530 may be between approximately 40 nm and approximately 60 nm or an odd number multiple thereof.

The thickness of a heavily-doped gallium-nitride layer 535 may be greater than the thickness of an undoped or moderately-doped gallium-nitride layer in each layer pair. This is because the heavily-doped gallium-nitride layers will be converted to porous gallium nitride, which has a lower refractive index than that for the solid undoped or moderately-doped gallium-nitride layers. The refractive index $n_p$ for the porous gallium nitride may be determined from the following expression:

$$n_p \approx 2.4 - 1.4\rho$$

where $\rho$ is the volumetric porosity of the porous gallium nitride. The thicknesses $t_2$ of the heavily-doped gallium-nitride layers 535 may be selected such that after being etched to form porous layers, the resulting thickness of each layer corresponds to approximately ¼ wavelength (or an odd-number multiple thereof) of the VCSEL's designed lasing wavelength. For example, the thickness $t_2$ may be determined approximately from the following relation:

$$t_2 \approx \frac{M\lambda_l}{4n_p}$$

Figure 5B:
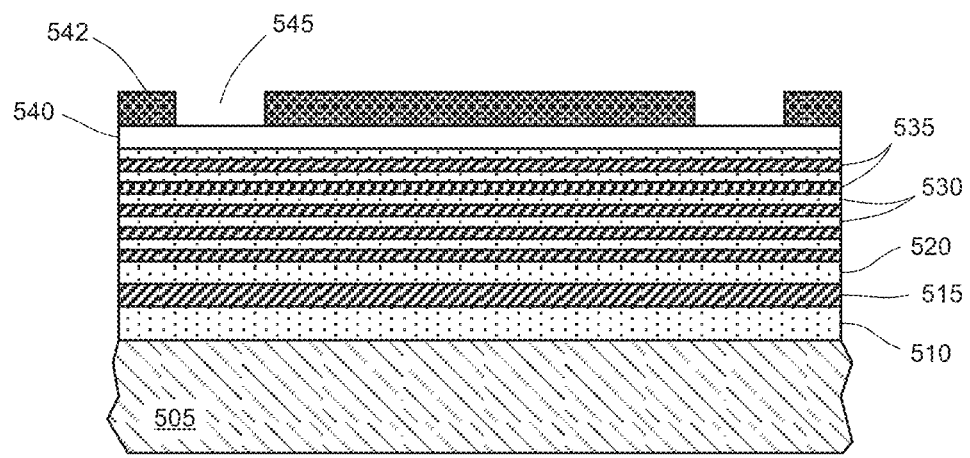
FIGS. 5B-5E depict structures associated with a process for forming a high-reflective DBR, according to some embodiments.

Following deposition of the undoped or moderately-doped and heavily-doped layer pairs, a hard mask 540 may be deposited over the DBR structure, as illustrated in FIG. 5B. The hard mask may comprise an oxide (e.g., silicon oxide) or any other suitable inorganic material that can be etched by reactive ion etching, for example. The hard mask may be resistant to etching by nitric acid, or the etchant used to porosify the heavily-doped gallium-nitride layers 535. The inventors found that a polymeric resist was undesirably etched by the concentrated nitric acid. In some embodiments, the hard mask 540 may be deposited by plasma-enhanced chemical vapor deposition (PECVD), though other deposition processes may be used. A thickness of the hard mask may be between approximately 50 nm and approximately 400 nm. A layer of resist 542 (e.g., photoresist) may be deposited over the hard mask 540 and patterned using any suitable lithographic process to open up vias 545 in the resist. The resulting structure may appear as illustrated in FIG. 5B.

Figure 5C:
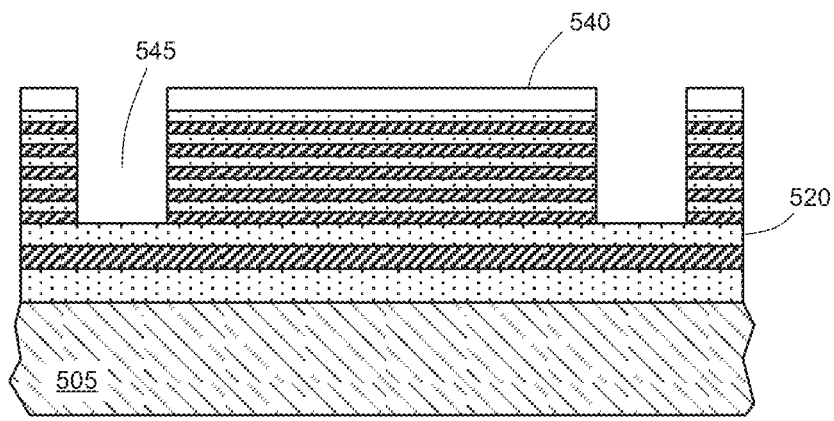

The vias 545 in the photoresist may be used to etch vias through the hard mask 540, as indicated in FIG. 5C. The etching process to open vias in the hard mask may comprise a selective dry etch (e.g., an anisotropic reactive ion etch that selectively removes the hard mask without removing the photoresist) or a selective wet etch. The selective etch may transfer the via pattern to the hard mask 540. After the vias 545 have been transferred to the hard mask 540, subsequent selective, anisotropic dry etching may be used to form vias 545 through the undoped and heavily-doped layer pairs of the DBR structure. According to some embodiments, a chlorine-based etch recipe is used to etch vias 545 through the gallium-nitride layer pairs. The vias may extend down to, and possibly into, the undoped layer 520, according to some embodiments. The etch through the layer pairs may be a timed etch.

In some cases, the etched vias 545 may be larger than depicted in FIG. 5C, and may remove a large region of layer pairs around the DBR structure. For example, the removal of layer pairs may leave a mesa on the substrate 505 comprising the undoped or moderately-doped and heavily doped layer pairs at the location of each VCSEL. Regardless of their size, the vias may expose edges of undoped or moderately-doped and heavily-doped layer pairs in the DBR structure.

Figure 5D:
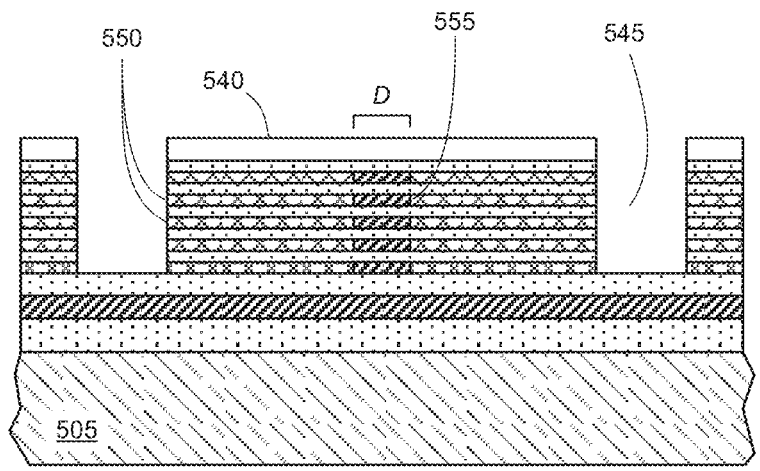

The DBR structure may then be subjected to an electrochemical etch using concentrated nitric acid as described above in connection with FIG. 3. The etch may be performed at room temperature, and with an applied bias between the etchant bath and the substrate 505 or the conductive layer 515. In some implementations, the applied bias may be between approximately 1.3 V and approximately 3 V. In some cases, the EC etching may last between approximately 2 minutes and approximately 30 minutes. According to some embodiments, the etching may continue for a time period of up to 10 hours, depending upon the extent of lateral etching desired and bias voltage. In various embodiments, the EC etching converts the heavily doped gallium-nitride layers 535 to porous gallium-nitride layers 550, as depicted in FIG. 5D. The etch may proceed laterally from the vias 545 or exposed edges of the layer pairs toward the center of the DBR structure.

In some embodiments, the etch may proceed laterally across the entire DBR structure and convert each heavily-doped layer to porous gallium nitride. In other embodiments, the etch may be timed to stop before etching entirely through the layers, and a central region of the heavily doped layers may not be etched. The central region may form a pillar 555 of solid gallium-nitride layers. The remaining pillar 555 may provide added structural support to the DBR structure, and may provide a low-resistance current path centrally to an optical axis of the VCSEL, so that carriers injected from the n-conductivity side of the VCSEL overlap efficiently with the laser's optical cavity mode. The surrounding porous regions in the DBR may have higher electrical resistivity and effectively function as current-blocking layers on the n-side of the device. According to some embodiments, a transverse dimension D of the pillar 555 may be less than one-half wavelength of the VCSEL's emission wavelength modified by the refractive index of the pillar. In some cases, a transverse dimension D of the pillar 555 may be less than one-quarter wavelength of the VCSEL's emission wavelength modified by the refractive index of the pillar.

Figure 5E:
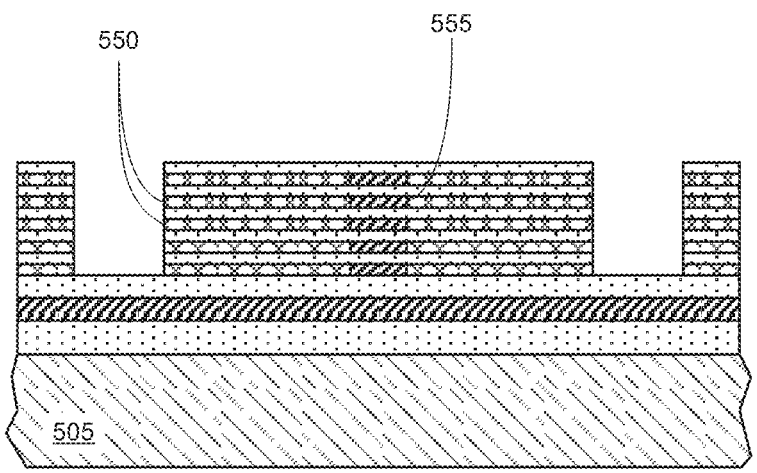

After the heavily doped layers 535 have been converted to porous layers 550, the hard mask 540 may be removed from the substrate, as depicted in FIG. 5E. In some implementations, a wet buffered oxide etch (BOE) may be used to remove the hard mask 540. The resulting substrate may then be cleaned and subjected to further processing to form a cavity region above the bottom-side DBR structure and a top-side DBR reflector.

Figure 5F:
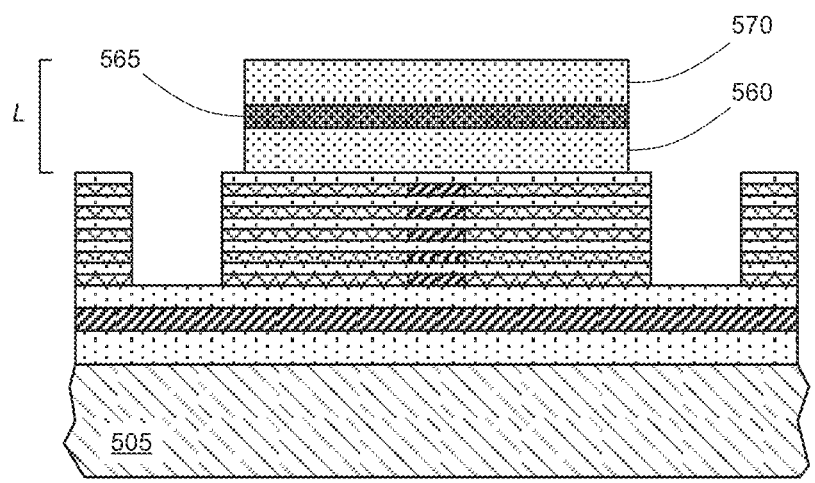
FIG. 5F depicts a cavity region formed on a high-reflective DBR, according to some embodiments.

According to some embodiments, fabrication of the cavity region may comprise depositing an n-type gallium-nitride layer 560, multiple quantum wells 565 or superlattice (SL) layer for the active region, and a p-type gallium-nitride layer 570 to form a structure as depicted in FIG. 5F. The n-type gallium-nitride layer, multiple quantum wells, and a p-type gallium-nitride layer may be formed by epitaxial growth, which may comprise metal-organic chemical vapor deposition and/or atomic layer deposition. In some embodiments, a planarization step and patterned hard mask may be used to prepare the substrate for subsequent epitaxial growth of the cavity region. In some implementations, a resist may be patterned over layers used to form the cavity region, and selective etching may be used to remove the layers in areas around the cavity region.

The cavity region may have a length L, which may be between approximately one wavelength and approximately five wavelengths of the VCSEL's emission wavelength (as modified by the refractive index of the cavity region). The length L approximately determines a cavity length for the VCSEL. When the cavity length L is on the order of a few wavelengths, the VCSEL may comprise a microcavity that may support one or a few longitudinal optical modes. In some implementations, the cavity length L may be longer than five wavelengths.

Figure 5G:
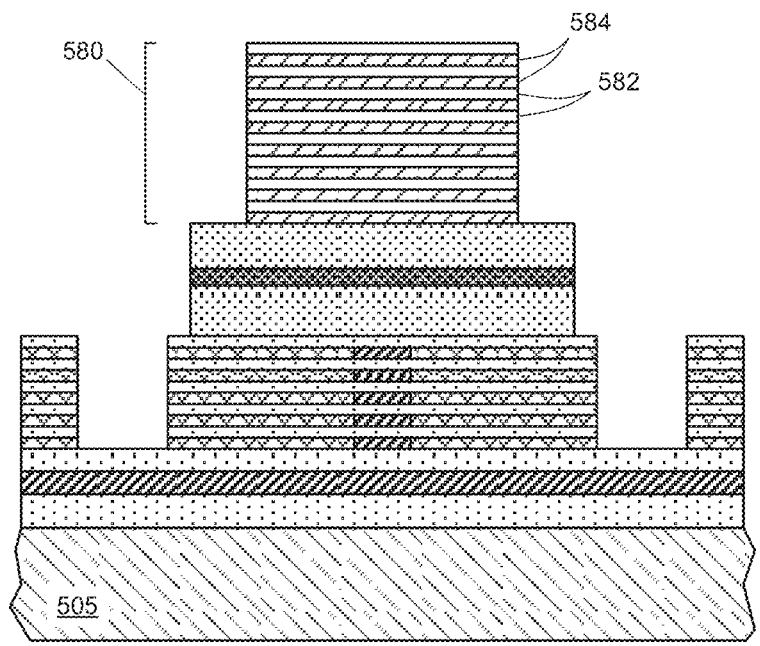
FIG. 5G depicts a second DBR formed on a cavity region for a VCSEL, for example.

After the cavity region has been formed, a top-side DBR 580 may be deposited to produce a VCSEL cavity as depicted in FIG. 5G. In some implementations, the top-side DBR may comprise a stack of dielectric layers. The dielectric layers may include layer pairs of an oxide (e.g., silicon oxide) having a first refractive index value and a second dielectric layer (e.g., silicon nitride) having a second refractive index value. The dielectric layers may be deposited by an MOCVD and/or ALD process. There may be between 10 and 20 dielectric layer pairs in a VCSEL, though some embodiments may include fewer layer pairs and other embodiments may include more layer pairs. The resulting GaN VCSEL may produce coherent radiation in the violet/blue spectral range (e.g., between approximately 400 nm and approximately 490 nm).

Other applications of highly porous gallium-nitride with small pore sizes include, but are not limited to, high-surface area electrodes for water splitting or other electrochemical reactions and stress-relief layers for multilayer epitaxial structures.

EXAMPLES

Figure 6:
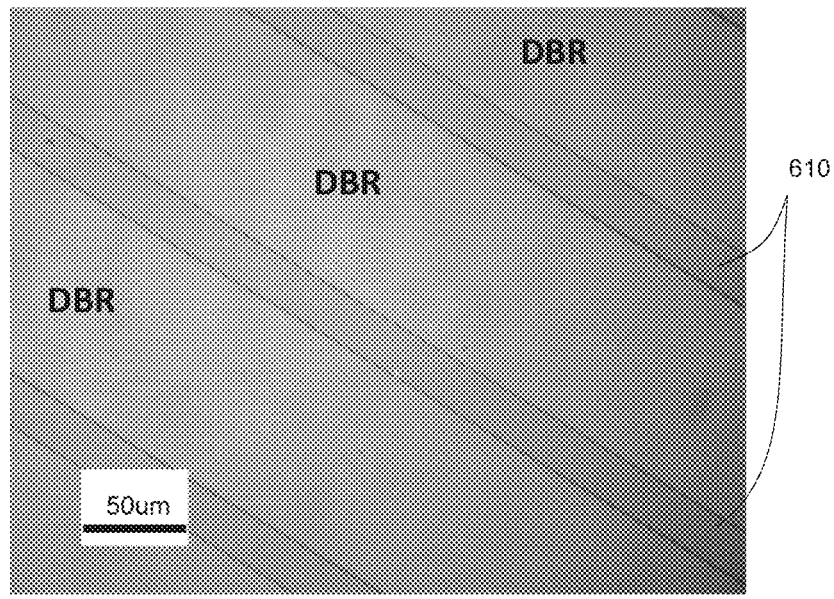
FIG. 6 is an optical micrograph showing etched openings into a multilayer stack and DBR regions adjacent to the etched openings.

Multilayer DBR structures were etched and characterized. In a first example, for which an etched sample is shown in FIG. 6, different striped vias 610 were etched through multiple GaN layer pairs formed on a substrate. The vias appear as dark stripes, and were etched by reactive ion etching in a chlorine-based plasma. The GaN layer pairs included undoped layers and heavily-doped GaN:Ge layers having a doping density of approximately $5 \times 10^{19}$ cm$^{-3}$. The EC etchant used to porosify the heavily-doped layers was nitric acid (HNO$_3$) having a concentration of approximately 16.7 M, and the applied bias was approximately 3 volts.

FIG. 6 is an optical image of the electrochemically etched GaN structure obtained with a microscope. Extending radially and laterally around the striped vias 610 are regions having nanoporous GaN layers. The regions containing the nanoporous GaN layers appear lighter under the optical microscope due to an increased reflectivity. A uniform color shading in the microscope image indicates good spatial uniformity of the nanoporous GaN layers.

Figure 7:
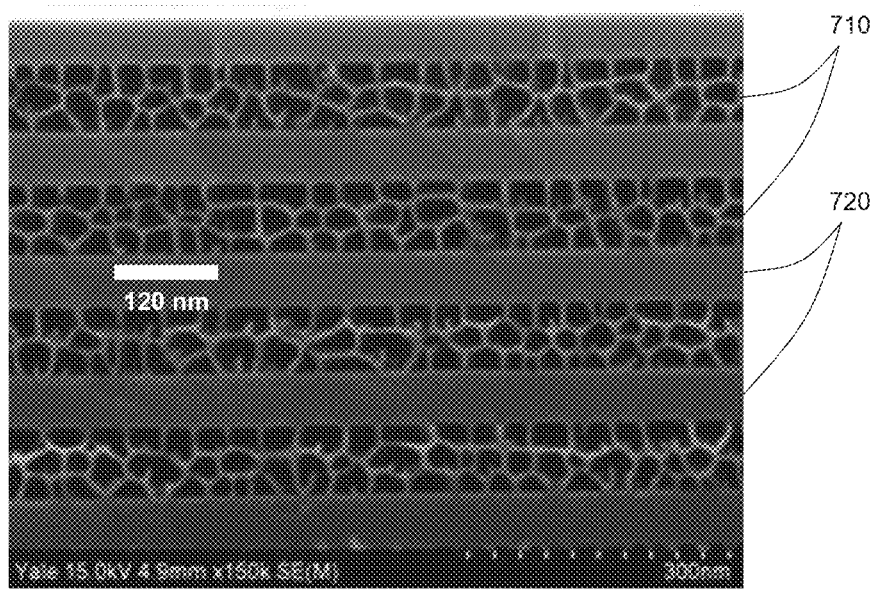
FIG. 7 is a scanning-electron micrograph (SEM) showing pore morphology of EC-etched gallium-nitride layers in a DBR structure, according to some embodiments.

The microscopic morphology of the etched nanoporous GaN was examined by scanning electron microscopy (SEM), and an exemplary micrograph is shown in FIG. 7. The micrograph shows an elevation view of the porous and non-porous GaN layers near a via 610. The non-porous layer corresponds to the undoped GaN, and the porous layers correspond to the heavily-doped GaN layers. The micrograph also indicates high uniformity and high volumetric porosity (greater than about 80%) of the EC-etched layers. More than half of the pores have a maximum transverse width W, less than about 100 nm, with some smaller than about 30 nm. Measurements indicate that more than 70% of the pores, and even more than 90% of its pores, have a maximum transverse width less than about 100 nm. The maximum transverse width may be less than a length of the pores (e.g., the pores may extend into the page along a lateral etching direction by a distance greater than their transverse width. The transverse dimensions are very uniform, with over 70%, and even over 90%, having a maximum transverse dimension between 30 nm and 90 nm.

Figure 8:
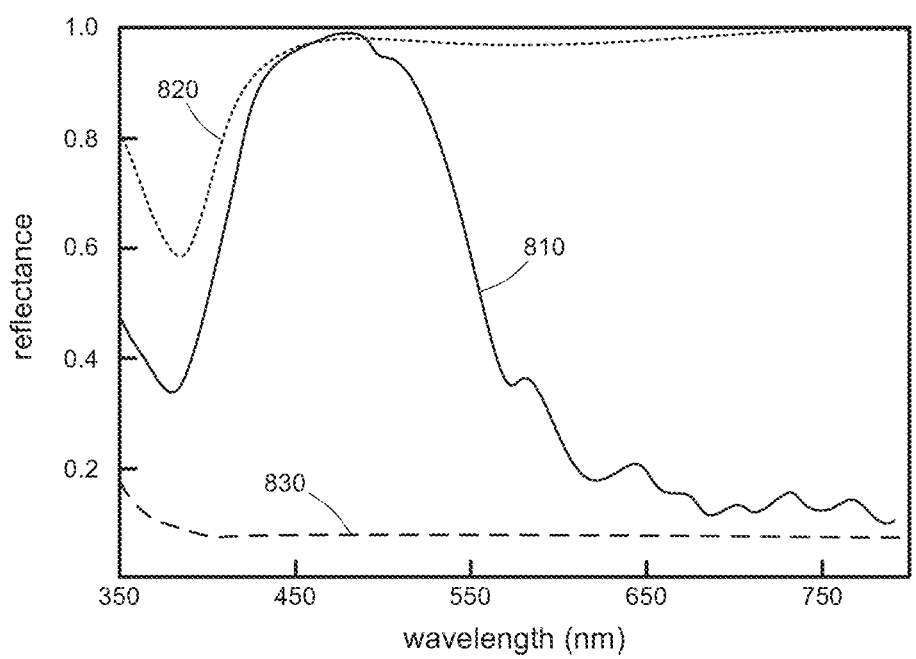
FIG. 8 shows measured reflectance from a GaN DBR having nanoporous gallium-nitride layers.

The reflectance of the nanoporous/non-porous GaN DBR was measured by a micro-reflectance setup. For these measurements, the optical spot size used to probe the DBR had a diameter of approximately 10 μm, and was incident on an etched region adjacent to a via 610. The absolute reflectance was calibrated with measurements made for a silver mirror and a sapphire substrate, both having well-established reflectance spectra. The estimated accuracy of the reflectance measurement is better than 0.5%. Measurements were made on samples etched under different EC etching conditions and having different doping densities. FIG. 8 shows a reflectance spectrum 810 measured for one sample that included 10 layer pairs in which the heavily-doped layers had a doping density of $5 \times 10^{19}$ cm$^{-3}$. The bias for the EC etching was approximately 3 V, and the resulting volumetric porosity of the anodized layers was over 60%. The reflectance spectrum 810 shows a peak reflectance that is well over 95%. For reference, calibration spectra for silver (curve 820) and sapphire (curve 830) are also plotted.

Figure 9:
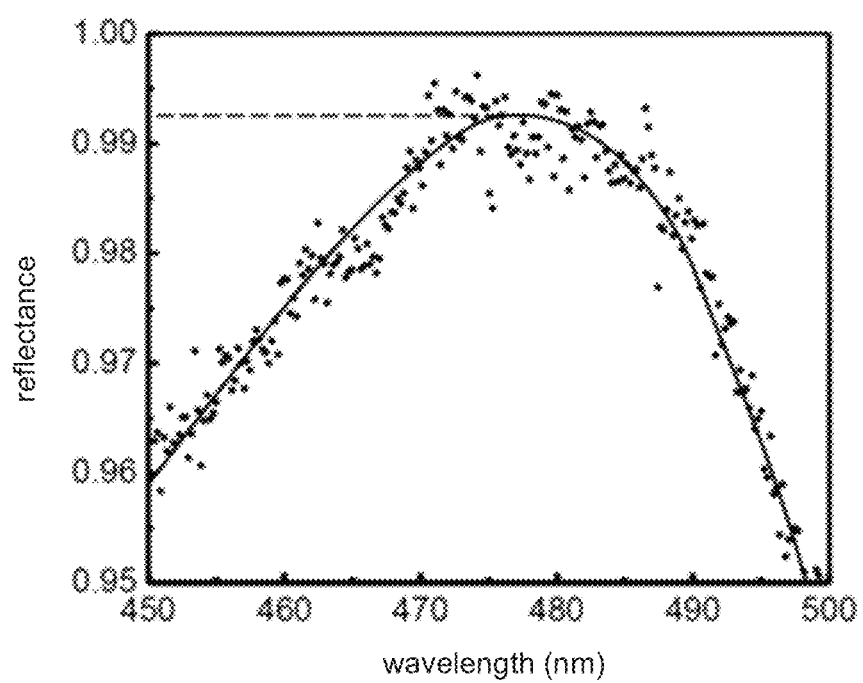
FIG. 9 shows measured reflectance greater than 99% from a GaN DBR having nanoporous gallium-nitride layers.

The peak reflectance for the sample is shown in higher resolution in FIG. 9. With correct doping levels and under selected EC etching conditions, a peak reflectance of more than 99% can be reproducibly obtained for a gallium-nitride DBR structure. The bandwidth over which the reflectance is greater than 98% is approximately 27 nm and is centered at approximately 480 nm. Accordingly, the DBR structure is very suitable for a cavity mirror of a VCSEL designed to emit blue light.

The technology described herein may be embodied as a method of fabrication, of which at least one example has been provided. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention.

Accordingly, the foregoing description is by way of example only and is not intended as limiting. The invention is limited only as defined in the following claims and the equivalents thereto.

What is claimed is:

1. A porous gallium-nitride layer having a majority of its pores with a maximum transverse width less than approximately 100 nm and having a volumetric porosity greater than 10%, wherein an n-type doping density of the porous gallium-nitride layer is between approximately $5 \times 10^{19}$ cm$^{-3}$ and approximately $2 \times 10^{20}$ cm$^{-3}$,
wherein the pores comprise lateral pores arranged in at least two adjacent, vertically-spaced rows of lateral pores.

2. The porous gallium-nitride layer of claim 1, wherein over half of the pores of the gallium-nitride layer have a maximum transverse width between approximately 30 nm and approximately 90 nm.

3. The porous gallium-nitride layer of claim 1, wherein the pores have walls with a root-mean-square surface roughness less than approximately 10 nm.

4. The porous gallium-nitride layer of claim 1, wherein the volumetric porosity is greater than 60%.

5. The porous gallium-nitride layer of claim 1 included in an electrode.

6. A semiconductor light emitting device comprising:
at least one buried porous gallium-nitride layer wherein a majority of the pores of the at least one buried porous gallium-nitride layer have a maximum transverse width less than approximately 100 nm and the at least one buried porous gallium-nitride layer has a volumetric porosity greater than 10%, wherein the at least one buried porous gallium-nitride layer has an n-type doping density between approximately $5 \times 10^{19}$ cm$^{-3}$ and approximately $2 \times 10^{20}$ cm$^{-3}$,
wherein the pores comprise lateral pores arranged in at least two adjacent, vertically-spaced rows of lateral pores.

7. The semiconductor light emitting device of claim 6, wherein over 70% of the pores of the at least one buried porous gallium-nitride layer have a maximum transverse width between approximately 30 nm and approximately 90 nm.

8. The semiconductor light emitting device of claim 6, wherein the at least one buried porous gallium-nitride layer comprises a plurality of porous gallium-nitride layers separated by non-porous gallium-nitride layers arranged in a first distributed Bragg reflector (DBR).

9. The semiconductor light emitting device of claim 8, wherein the plurality of porous gallium-nitride layers include non-porous regions located centrally within the DBR that form a pillar of non-porous gallium nitride.

10. The semiconductor light emitting device of claim 8, wherein the first DBR is arranged as an n-side reflector for a vertical-cavity surface-emitting laser (VCSEL).

11. The semiconductor light emitting device of claim 10, wherein the first DBR has a reflectance greater than 99% for a lasing wavelength of the VCSEL.

12. The semiconductor light emitting device of claim 11, wherein the first DBR has reflectance values greater than 98% over a bandwidth greater than approximately 20 nm.

13. The semiconductor light emitting device of claim 8, further comprising a current-spreading layer having a doping density greater than $1 \times 10^{18}$ cm$^{-3}$ located adjacent to the distributed Bragg reflector.

14. The semiconductor light emitting device of claim 6, wherein the pores of the at least one buried porous gallium-nitride layer have walls with a root-mean-square surface roughness less than approximately 10 nm.

15. The semiconductor light emitting device of claim 8, wherein a dopant for the n-type doping in the at least one buried porous gallium-nitride layer is germanium.

16. A method for forming porous gallium nitride, the method comprising:
exposing heavily-doped gallium nitride to an etchant, wherein the heavily-doped gallium nitride has an n-type doping density between approximately $5 \times 10^{19}$ cm$^{-3}$ and approximately $2 \times 10^{20}$ cm$^{-3}$;
applying an electrical bias between the etchant and the heavily-doped gallium nitride, wherein the electrical bias has a value between approximately 1.3 volts and 3 volts; and
electrochemically etching the heavily-doped gallium nitride to produce porous gallium nitride having a volumetric porosity greater than approximately 10% and a majority of pores with a maximum transverse width less than approximately 100 nm.

17. The method of claim 16, wherein a dopant for the heavily-doped gallium nitride is germanium.

18. The method of claim 16, wherein the etchant is nitric acid having a concentration between 60% and approximately 80% by weight.

19. The method of claim 16, wherein the electrochemical etching comprises forming a distributed Bragg reflector (DBR), the method further comprising spreading etching current during the electrochemical etching with a current-spreading layer of doped gallium nitride located adjacent to the DBR.

20. The method of claim 16, wherein the heavily-doped gallium nitride is arranged in a plurality of layers that are separated by undoped or moderately-doped gallium-nitride layers, the method further comprising etching vias into the plurality of layers and the undoped or moderately-doped gallium-nitride layers to expose edges of the plurality of layers, wherein the electrochemical etching comprises lateral etching of the plurality of layers.

21. The method of claim 16, wherein the pores comprise lateral pores.

22. The method of claim 16, wherein the pores comprise lateral pores arranged in at least two adjacent, vertically-spaced rows of lateral pores.

* * * * *